US010430479B1

United States Patent
Parikh et al.

(10) Patent No.: US 10,430,479 B1
(45) Date of Patent: *Oct. 1, 2019

(54) METHOD AND SYSTEM FOR PROVIDING DYNAMIC PERSONALIZED RECOMMENDATIONS FOR A DESTINATION

(71) Applicant: Google Inc., Mountain View, CA (US)

(72) Inventors: Jignashu Parikh, San Jose, CA (US); Subhadip Sarkar, San Jose, CA (US)

(73) Assignee: Google LLC, Mountain View, CA (US)

( * ) Notice: Subject to any disclaimer, the term of this patent is extended or adjusted under 35 U.S.C. 154(b) by 296 days.

This patent is subject to a terminal disclaimer.

(21) Appl. No.: 15/359,353

(22) Filed: Nov. 22, 2016

Related U.S. Application Data

(63) Continuation of application No. 13/295,477, filed on Nov. 14, 2011, now Pat. No. 9,519,722.

(51) Int. Cl.
*G06F 16/95* (2019.01)
*G06F 16/9535* (2019.01)
*G06F 16/9537* (2019.01)

(52) U.S. Cl.
CPC ...... *G06F 16/9535* (2019.01); *G06F 16/9537* (2019.01)

(58) Field of Classification Search
CPC .................................................. G06F 16/9535
USPC ........................ 707/706, 722, 736, 758, 781, 707/999.003–999.004; 701/209
See application file for complete search history.

(56) References Cited

U.S. PATENT DOCUMENTS

| | | | |
|---|---|---|---|
| 7,082,365 B2 | 7/2006 | Sheha et al. |
| 7,321,826 B2 | 1/2008 | Sheha et al. |
| 7,526,294 B2 | 4/2009 | Pfleging et al. |
| 7,623,966 B2 | 11/2009 | Butler, Jr. |
| 7,720,844 B2 | 5/2010 | Chu et al. |
| 7,741,978 B2 | 6/2010 | Becker |
| 8,005,489 B2 | 8/2011 | Fransioli |
| 8,279,090 B2 | 10/2012 | Becker |
| 2007/0010942 A1 | 1/2007 | Bill |
| 2007/0061245 A1 | 3/2007 | Ramer et al. |
| 2008/0076451 A1 | 3/2008 | Sheha et al. |
| 2008/0097966 A1 | 4/2008 | Choi et al. |

(Continued)

OTHER PUBLICATIONS

Non-final Office action received in U.S. Appl. No. 13/295,477 dated Jan. 29, 2015.

(Continued)

*Primary Examiner* — Syling Yen
(74) *Attorney, Agent, or Firm* — Foley & Lardner LLP

(57) ABSTRACT

Methods and systems for providing a user with content relevant to a location of interest to the user, when the user is determined to be at or near the location, are presented. The user's interest in the location may be determined based on queries about the location received from the user prior to the user arriving at the location. The queries received from the user about the location are used to build a location recommendation model, which generates personalized content relevant to the location and to one or more interest verticals identified for the user. The location recommendation model is built using a location recommendation engine that collects data about the user, the queried location, one or more associations between the user, the queried location, and/or one or more other users, as well as various other information related to the user's interests and the queried location.

20 Claims, 7 Drawing Sheets

(56) References Cited

U.S. PATENT DOCUMENTS

| | | |
|---|---|---|
| 2008/0172357 A1 | 7/2008 | Rechis et al. |
| 2009/0012955 A1 | 1/2009 | Chu et al. |
| 2009/0106040 A1 | 4/2009 | Jones |
| 2009/0210480 A1 | 8/2009 | Sivasubramaniam et al. |
| 2010/0153488 A1 | 6/2010 | Mittal et al. |
| 2010/0185605 A1 | 7/2010 | Chu et al. |
| 2010/0241994 A1 | 9/2010 | Wiley et al. |
| 2011/0035284 A1 | 2/2011 | Moshfeghi |
| 2011/0196863 A1 | 8/2011 | Marcucci et al. |
| 2011/0238690 A1 | 9/2011 | Arrasvuori et al. |
| 2011/0270884 A1 | 11/2011 | Li et al. |
| 2011/0276565 A1 | 11/2011 | Zheng et al. |
| 2012/0047152 A1 | 2/2012 | Purdy |
| 2013/0006904 A1 | 1/2013 | Horvitz et al. |
| 2013/0007089 A1 | 1/2013 | O'Donnell et al. |
| 2014/0297415 A1 | 10/2014 | Chu et al. |

OTHER PUBLICATIONS

U.S. Notice of Allowance on U.S. Appl. No. 13/295,477 dated Aug. 5, 2016.

U.S. Office Action on U.S. Appl. No. 13/295,477 dated Oct. 19, 2015.

U.S. Office Action on U.S. Appl. No. 13/295477 dated May 16, 2016.

FIG. 5

METHOD AND SYSTEM FOR PROVIDING DYNAMIC PERSONALIZED RECOMMENDATIONS FOR A DESTINATION

CROSS-REFERENCES TO RELATED APPLICATIONS

The present application claims the benefit of priority under 35 U.S.C. § 120 as a continuation of U.S. patent application Ser. No. 13/295,477, filed Nov. 14, 2011, which is incorporated by reference herein in its entirety.

FIELD OF THE INVENTION

The present disclosure generally relates to methods and systems for providing content to users. More specifically, aspects of the present disclosure relate to providing content relevant to a location of a user based on a prior determination of the user's interest in the location.

BACKGROUND

As transportation options available to individuals continue to expand, an increasing number of destinations are becoming more accessible than they once were. Whether planning to travel alone, with family, friends, or colleagues, an individual will often conduct some research about the particular location that he or she is traveling to. For example, an individual (hereafter referred to as a "user") planning a vacation for his or her family may want to find out certain things about their destination in advance, such as recommended hotels, great places to eat, fun activities for children, and the like.

A popular resource for obtaining information about a destination is the Internet, where a user can enter a query or search terms, such as "top-rated hotels in Miami" or "best restaurants in Philadelphia," and receive a wealth of relevant content and information in response. Furthermore, a user researching a particular destination will likely perform several Internet searches, sometimes spreading out these searches over a period of time prior to actually arriving at the destination.

SUMMARY

This Summary introduces a selection of concepts in a simplified form in order to provide a basic understanding of some aspects of the present disclosure. This Summary is not an extensive overview of the disclosure, and is not intended to identify key or critical elements of the disclosure or to delineate the scope of the disclosure. This Summary merely presents some of the concepts of the disclosure as a prelude to the Detailed Description provided below.

One embodiment of the present disclosure relates to a method comprising: receiving at a server from a user, at least one query about a particular location; determining that the particular location is different from a location of the user; responsive to determining that the particular location is different from the location of the user, generating a model for the particular location based on information extracted from the at least one query received from the user, the model indicating one or more associations between the particular location and at least one interest vertical identified for the user; storing the model generated for the particular location; receiving data indicating that the user is at or near the particular location; responsive to receiving the data indicating that the user is at or near the particular location, generating content relevant to the particular location and the at least one interest vertical identified for the user based on the model stored for the particular location; and serving, via a network, the content relevant to the particular location and the at least one interest vertical to a user device in a format suitable for presentation on the user device.

In another embodiment of the disclosure, the method further comprises identifying at least one interest vertical for the user based on the at least one query received about the particular location, and generating at least one interest vertical map based on the at least one interest vertical identified for the user, the at least one interest vertical map identifying associations between the at least one interest vertical and the particular location.

In another embodiment, the method further comprises: retrieving the content relevant to the particular location and the at least one interest vertical identified for the user using the model stored for the particular location; combining the retrieved content and the at least one interest vertical map generated for the user; and serving, via a network, the combined content and the at least one interest vertical map to a user device in a format suitable for presentation on the user device.

In yet another embodiment of the disclosure, the method further comprises: receiving a query from the user; determining that the received query originated from a location within a specified geographical range of the particular location; and generating data indicating that the user is at or near the particular location.

In still another embodiment of the disclosure, the method further comprises: receiving location data from a user device associated with the user; identifying a location of the user device based on the received location data; and determining that the identified location of the user device is within a specified geographical range of the particular location.

Another embodiment of the present disclosure relates to a system comprising at least one processor, and at least one memory storing computer-executable instructions that, when executed by the at least one processor, causes the at least one processor to: receive from a user at least one query about a particular location; determine that the particular location is different from a location of the user; responsive to determining that the particular location is different from the location of the user, generate a model for the particular location based on information extracted from the at least one query received from the user, the model indicating one or more associations between the particular location and at least one interest vertical identified for the user; store the model generated for the particular location; receive data indicating that the user is at or near the particular location; responsive to receiving the data indicating that the user is at or near the particular location, generate content relevant to the particular location and the at least one interest vertical identified for the user based on the model stored for the particular location; and serve, via a network, the content relevant to the particular location and the at least one interest vertical to a user device in a format suitable for presentation on the user device.

In another embodiment, the at least one processor of the system is further caused to identify at least one interest vertical for the user based on the at least one query received about the particular location, and generate at least one interest vertical map based on the at least one interest vertical identified for the user, the at least one interest vertical map identifying associations between the at least one interest vertical and the particular location.

In still another embodiment, the at least one processor of the system is further caused to: retrieve the content relevant to the particular location and the at least one interest vertical identified for the user using the model stored for the particular location; combine the retrieved content and the at least one interest vertical map generated for the user; and serve, via a network, the combined content and the at least one interest vertical map to a user device in a format suitable for presentation on the user device.

In yet another embodiment, the at least one processor of the system is further caused to: receive a query from the user; determine that the received query originated from a location within a specified geographical range of the particular location; and generate data indicating that the user is at or near the particular location.

In another embodiment, the at least one processor of the system is further caused to: receive location data from a user device associated with the user; identify a location of the user device based on the received location data; and determine that the identified location of the user device is within a specified geographical range of the particular location.

Still another embodiment of the present disclosure relates to at least one non-transitory computer-readable medium storing computer-executable instructions that, when executed by at least one processor, causes the at least one processor to perform a method comprising: receiving from a user, at least one query about a particular location; determining that the particular location is different from a location of the user; responsive to determining that the particular location is different from the location of the user, generating a model for the particular location based on information extracted from the at least one query received from the user, the model indicating one or more associations between the particular location and at least one interest vertical identified for the user; storing the model generated for the particular location; receiving data indicating that the user is at or near the particular location; responsive to receiving the data indicating that the user is at or near the particular location, generating content relevant to the particular location and the at least one interest vertical identified for the user based on the model stored for the particular location; and serving, via a network, the content relevant to the particular location and the at least one interest vertical to a user device in a format suitable for presentation on the user device.

In other embodiments of the disclosure, the methods and systems described herein may optionally include one or more of the following additional features: the at least one interest vertical identified for the user is specific to the particular location, the at least one interest vertical identified for the user is further based on one or more queries received from the user about content other than the particular location, the retrieved content relevant to the particular location and the at least one interest vertical identified for the user includes at least one of a promotional content item and a web page, and/or the model generated for the particular location is further based on information extracted from one or more queries received from the user about content other than the particular location.

Further scope of applicability of the present invention will become apparent from the Detailed Description given below. However, it should be understood that the Detailed Description and specific examples, while indicating preferred embodiments of the invention, are given by way of illustration only, since various changes and modifications within the spirit and scope of the invention will become apparent to those skilled in the art from this Detailed Description.

BRIEF DESCRIPTION OF DRAWINGS

These and other objects, features and characteristics of the present disclosure will become more apparent to those skilled in the art from a study of the following Detailed Description in conjunction with the appended claims and drawings, all of which form a part of this specification. In the drawings:

FIG. 5 is an example user interface that includes location-specific content and recommendations according to one or more embodiments described herein.

Figure 1:
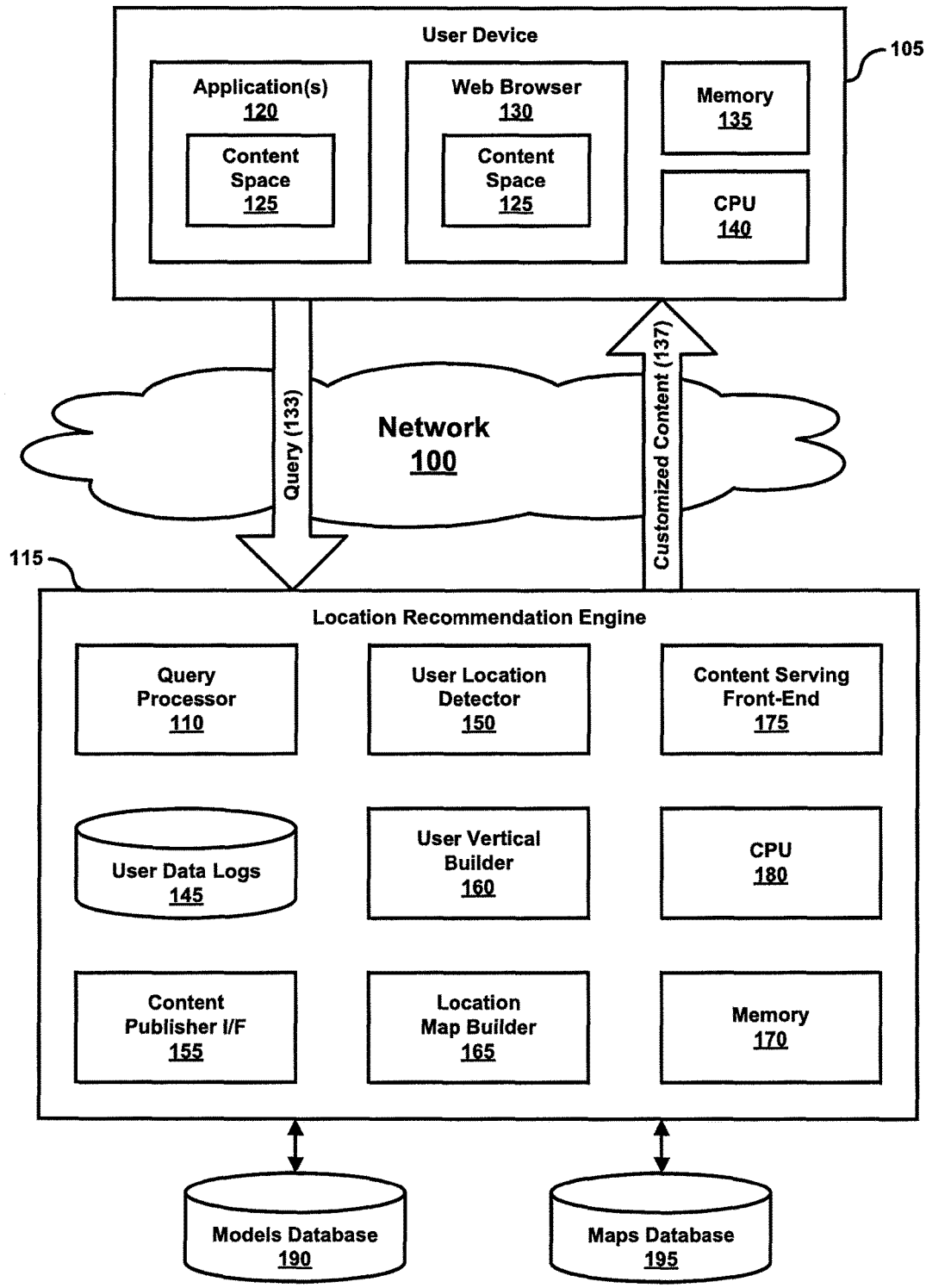
FIG. 1 is a schematic diagram illustrating an example content generation and presentation system in which various embodiments of the present disclosure may be implemented.

The headings provided herein are for convenience only and do not necessarily affect the scope or meaning of the claimed invention.

In the drawings, the same reference numerals and any acronyms identify elements or acts with the same or similar structure or functionality for ease of understanding and convenience. The drawings will be described in detail in the course of the following Detailed Description.

DETAILED DESCRIPTION

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other obvious features not described in detail herein. Additionally, some well-known structures or functions may not be shown or described in detail below, so as to avoid unnecessarily obscuring the relevant description.

Embodiments of the present disclosure relate to techniques, methods and systems for providing a user with content relevant to a location of interest to the user, when the user is determined to be at or near the location. In at least some arrangements, the user's interest in the location may be determined based on a plurality of queries about the location received from the user prior to the user arriving at the location. For example, a user who is planning a vacation to a certain destination may conduct some research on the destination prior to leaving. The user may want to obtain information about recommended hotels, top-rated restaurants, popular attractions, etc., specific to the destination to which he or she is traveling. In the following description the terms "location" and "destination" are used interchangeably to refer to a physical location or place (e.g., a geographically-defined area or territory such as a state or country, an identifiable landmark such as Niagara Falls or The Grand Canyon, a specific commercial entity such as "Disney World," and the like).

Online or web-based information providers are one type of resource that a user might utilize when performing research on a particular destination. For example, a user may conduct a search (e.g., using a search service) by entering one or more search terms, and be provided in return with a listing of various websites and/or promotional content related to the search terms. Such data and information searches, which may be referred to simply as "queries" for purposes of brevity in the present disclosure, may identify a destination of interest to the user making the queries. For example, a user may make queries such as "Philadelphia hotels," "best restaurants in Philadelphia," "Philadelphia attractions," "cheapest airfare to Philadelphia," and the like. As will be described in greater detail herein, these example queries may be used to identify Philadelphia as a location of interest to the user.

Accordingly, one or more embodiments of the disclosure relate to using queries received from a user about a location to build (e.g., generate, create, construct, etc.) a location recommendation model for the user. As will be further described below, the location recommendation model may be built using a location recommendation engine that collects (e.g., extracts, receives, etc.) information about the user, the queried location, one or more associations between the user, the queried location, and/or one or more other users, as well as various other data related to the user's interests and the queried location.

In at least one embodiment, a location recommendation model may be built for a user based on queries made by the user while the user is at a first location, and the location recommendation model then used to generate personalized content and recommendations that can be provided to the user while the user is at a second location (e.g., the second location being a location of interest to the user as determined from the queries made by the user while at the first location). Additionally, queries made by a user may be received (e.g., at a location recommendation engine) from any one or more of a variety of user devices of the user (e.g., belonging to, authorized for use by, or otherwise associated with the user), and personalized content and recommendations provided to any one or more of the same or different such user devices for presentation to the user. Examples of such user devices include a desktop computer, laptop computer, tablet computing device, mobile telephone, smartphone, as well as numerous other types or variations of such devices similar in nature and/or functionality.

In describing various embodiments and features of the present disclosure, reference is sometimes made to "queries received from a user." It should be understood that in the implementation context, "queries received from a user" means queries received from a device of a user (a "user device"), the device being configured for operation or use by the user. As such, "queries received from a user" and "queries received from a user device" may be used interchangeably at times for purposes of simplicity.

Additionally, one or more examples provided herein describe determining a location to be of interest to a user based on "queries" received from the user. It should be noted that the terms "query" and "queries" are not in any way intended to limit the scope of the disclosure. Rather, these terms are used herein to collectively describe numerous types of actions performed by a user online to obtain data and/or information about a particular subject, object, topic, interest, etc. Some examples of a query include a search performed using, for example, a search engine or search service, a question submitted via a web page, a request made in an e-mail, and the like.

In one example, queries may be received (e.g., at a location recommendation engine) from a user while the user is at a first location, such as the user's home or permanent location (described in greater detail below), where the queries are received, for example, via the user's desktop computer at the first location. According to one or more embodiments described herein, the queries received via the user's desktop computer at the first location may be used to generate personalized content and recommendations that can be provided to the user at a second location via a different device of the user, such as the user's mobile telephone.

In a scenario where a query made by a user is received via one or more portable user devices (e.g., laptop computer, mobile telephone, etc.) of the user, such a query may be considered as being made from a first location (e.g., the user's home or permanent location) where the one or more portable user devices of the user are determined to be located within a geographically-defined area or region associated with the first location at the time the query is made. For example, where a query made by a user is received (e.g., at a location recommendation engine) from the user's mobile telephone, and the mobile telephone is determined to be located within some geographical boundary defining location "A" at the time the query was made, then that query can be classified (e.g., identified, categorized, etc.) as being made by the user at location "A". As will be described in greater detail herein, the location of a user may be determined (or approximated) using any of a variety of techniques and/or devices known in the art. For example, in at least one embodiment, a user's location may be determined using a global position system (GPS) associated with a device of the user, such as the user's mobile telephone.

In some embodiments described herein, a "home" or "permanent" location may be assigned to (e.g., identified with, associated with, determined for, etc.) a user such that only queries made by the user (and thus received from a device of the user) about a location different from the user's home or permanent location are considered in building a location recommendation model for the user. Numerous measurements, bases, and/or factors can be used in classifying or determining a location as being different from a user's home location, depending on the implementation.

Additionally, in one or more embodiments, the building of a location recommendation model for a user may begin when the user makes at least one query about a location that is different from the user's current location. For example, if a user who is currently located in San Francisco makes a query such as "hotels New York," and no similar such query relevant to New York has previously been made by the user (e.g., within some predefined period of time, such as the previous two weeks, four weeks, two months, etc.) then this query may initiate the building of a location recommendation model for the user about New York (again, assuming that the building of such a model for the user has not already started).

Depending on the implementation, various thresholds (in addition to or instead of one (1)) may be used as a minimum number of queries that must be received (e.g., at a location recommendation engine) from a user about a particular location before a location recommendation model begins to be constructed for the user about the particular location. Furthermore, in some embodiments of the present disclosure, a location recommendation model about a particular location may not begin to be built for a user until a threshold number of queries about the particular location is received from the user within a given period of time (e.g., at least two queries received within the same day, at least five queries received within one week, at least ten queries received within a period of two consecutive weeks, etc.).

In at least one embodiment, a user's first query about a location different from the user's current location that triggers the building of a location recommendation model for the user about the different location, may be referred to as the first "local query" received from the user about this different location. As sometimes used herein, a "local query" means a query about businesses, travel-related topics (e.g., accommodations, transportation, etc.), weather, and the like, for a given location/region/address/area/etc. different from the user's current location.

The present disclosure contains some examples described in the context of advertisements. An advertisement is an entity (e.g., video, audio file, image, text, etc.) that presents a piece of information to a user and is designed to be used in whole or in part by the user. Ads can be provided (e.g., presented) to a user in electronic form, such as banner ads on a web page, as ads presented in a user interface associated with an application (e.g., a third-party application running on a user device), as ads presented with search results, as ads presented with e-mails, and the like. Such electronic ads may also contain links to other electronic content including web pages, images, audio files video files, etc. Advertisements may also be referred to as "promotional content" or one or more other similar such terms.

It should be noted that the location recommendation model and location recommendation engine described herein may each be referred to in numerous other ways in addition to or instead of "location recommendation model" and "location recommendation engine," without departing from their intended meanings and without limiting any of their respective features and/or functionalities. For example, the location recommendation model may also be referred to as a "destination recommendation model," "user destination model," "personalized destination tool," "local content model," as well as other identifiers, names and labels similar in nature to those mentioned. Irrespective of the terms or phrases used to refer to the location recommendation model and location recommendation engine, in the various embodiments described herein these features identify a destination of interest to a user, collect/compile data and information about the destination and various interests and associations of the user, and provide for display to the user personalized (e.g., customized) content relevant to the destination, when the user is determined to be at or near the destination.

When a user makes a request for online content, such as a web page, a video/audio clip, a game, or other online resource, one or more content requests can be initiated to retrieve the requested content from content publishers for presentation to the user on a user device. Examples of content publishers include publishers of web sites, search engines that publish search results in response to a query, and numerous other sources or parties that make information and/or experiences available for presentation to a user. In some arrangements, one or more additional items of content, such as advertisements, may be provided along with the requested content. In one scenario a user may be a member of a social network comprised of many other users, some of whom share a connection with the user or are in one of a variety of relations with the user. In such a social network context, a user may recommend or suggest certain content, including advertisements, to one or more other social network users.

It should be noted that in any of the various scenarios in which the methods or systems described herein collect personal information about a user, the user may be given the option to not have his or her personal information collected and/or used in any way. For example, a user may be provided with an opportunity to opt in/out of programs or features that may collect personal information, such as information about the user's geographic location, preferences, and the like. Furthermore, certain user data may be rendered anonymous in one or more ways before being stored and/or used, such that personally-identifiable information is removed. For example, a user's identity may be made anonymous so that no personally-identifiable information can be determined or collected for the user. Similarly, a user's geographic location may be generalized in situations where location information is obtained (e.g., limited to a city, zip code, or state level) so that a particular location of a user cannot be determined.

FIG. 1 shows an example content presentation system and surrounding environment in which various embodiments described herein may be implemented. The example system and environment shown includes a user device 105 and a location recommendation engine 115, which may be a server, computer, or the like.

The example environment also includes a network 100, such as a local area network (LAN), a wide area network (WAN), the Internet, or a combination thereof. The network 100 connects the user device 105 and the location recommendation engine such that various types of data and information can be exchanged or communicated over the network 100. The network 100 can also connect additional devices and servers (e.g., server engines) of the same or different type (not shown). The example system also includes a models database 190 and a maps database 195. These and other components of the system and environment shown in FIG. 1 will be described in greater detail below.

The user device 105 can be any of a number of different electronic devices under control of a user and capable of requesting and receiving resources. As used herein, a resource is any data that can be provided over the network 100, and can be identified by a resource address associated with the resource. Examples of resources include images, video, HTML pages, content (e.g., words, phrases, images, etc.), embedded information such as meta-information and hyperlinks, and also embedded instructions, such as JavaScript scripts. Examples of the user device 105 can be one or more personal computers, telephones, personal digital assistants (PDAs), television systems, etc., that are capable of sending and receiving data over the network 100. The user device 105 can also be a portable user device, such as a laptop computer, tablet computer, mobile communication device (e.g., cell phone, smartphone), and the like, capable of also sending and receiving data over the network 100.

The user device 105 may include one or more web browser tools 130 for viewing and interacting with web pages via a wired or wireless internet connection and/or via a mobile data exchange connection such as cellular, optical, near field communication, or some combination thereof. The web browser 130 may include designated content space 125. The content space 125 may be for the display of various types of content, such as web pages, search results, advertisements, e-mail, and the like. In at least some embodiments, the user device 105 may also include a computer processing unit (CPU) 140 and a memory 135.

The user device 105 may also include one or more applications 120, which in some embodiments may be third-party applications separate from (e.g., not associated or affiliated with) the location recommendation engine 115. These applications 120 can consist of software that runs on the user device 105 and performs certain functions or tasks for a user, such as providing user interfaces for messaging services or providing services related to games, videos, or music. Such an application may also be a mobile application consisting of software designed to run on a mobile user device, such as a cell phone or smartphone. Some example types of applications include multimedia (e.g., video or audio players, graphic or image viewers, etc.), communication (e.g., news or information clients, messaging or e-mail clients, etc.), games, productivity (e.g., calculators, calendars, task managers, etc.), as well as numerous other categories and types. An application 120 contained in the user device 105 may similarly include designated content space 125 for the display of content (e.g., ads) related to the application.

Content publishers, such as advertisers, may directly or indirectly submit, log, maintain, and utilize information in the location recommendation engine 115. For example, content publishers may access and/or interact with the location recommendation engine 115 via a content publisher interface (I/F) 155. Additionally, depending on the implementation, content publishers may be able to access and/or interact with the location recommendation engine 115 in one or more other ways.

In addition to the content publisher interface 155, the location recommendation engine 115 may also include a computer processing unit (CPU) 180, a memory 170, a query processor 110, a user location detector 150, a content-serving front-end, user data logs 145, a user vertical builder 160, and a location map builder 165.

In at least some embodiments, content publishers provide content items (e.g., advertisements) to the location recommendation engine 115 via the content publisher interface 155, and a content serving front-end 175 of the location recommendation engine 115, in turn, presents the content items as customized content 137 to the user device 105 using various methods described in greater detail below. Such customized (e.g., personalized) content 137 may be provided to the user device 105 in response to one or more queries 133 about a particular location being received by the location recommendation engine 115 and a determination being made by, for example, a user location detector 150 that the user submitting the queries 133 is at or near the queried location.

The customized content 137 provided to the user device 105 may be in the form of text, images, videos, audio files, as well as content combining one or more of any such forms. In at least one arrangement, advertisements provided to the user device 105 along with the customized content 137 may be in the form of graphical ads, such as banner ads, audio ads, video ads, still image ads, or any combination of these forms. Such content comprising the customized content 137 may also include embedded information or data, including links to one or more web pages, meta-information, and/or machine-executable instructions.

In any of the embodiments of the present disclosure, conventional content and/or ad serving methods and systems may be utilized in conjunction with the various features described herein. Additionally, in at least some embodiments, the location recommendation engine 115 identifies one or more candidate content items from the maps database 195 and/or user data logs 145, selects a particular combination of the candidate content items using an associated model from the models database 190, and provides the selected combination of content items (e.g., as the customized content 137) to the user device 105 for presentation to a user. Depending on the implementation, the location recommendation engine 115 may conduct an auction to determine which of a certain type of content item (e.g., ads) will be selected for presentation with the customized content 137.

Figure 2:
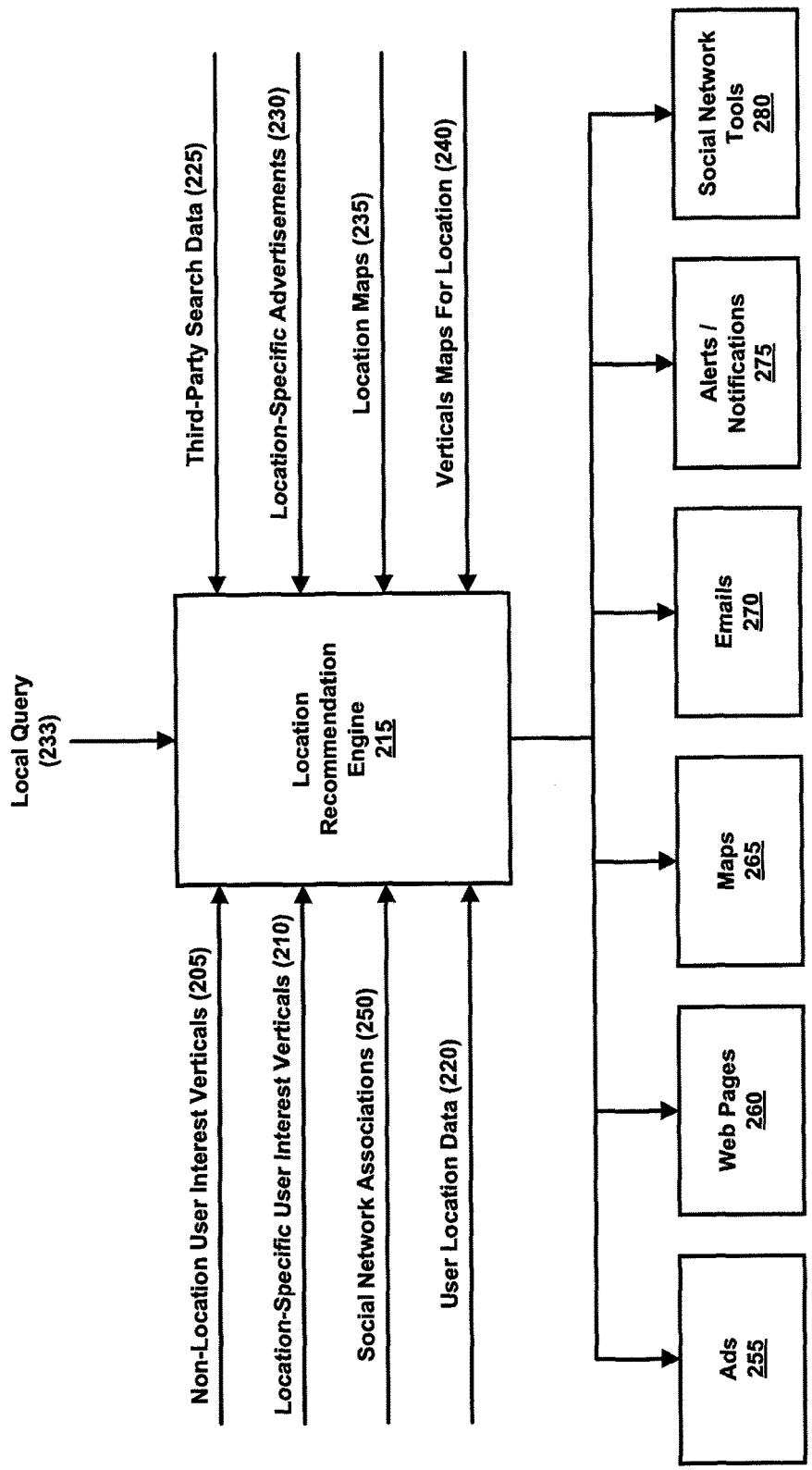
FIG. 2 is a block diagram illustrating an example location recommendation engine, including incoming data flows and output generated by the location recommendation engine according to one or more embodiments described herein.

FIG. 2 illustrates an example location recommendation engine that may be configured to receive (e.g., retrieve, extract, collect, etc.) various data and/or information, and use such data and/or information to generate personalized location-relevant content as output to a user. In at least some embodiments, the location recommendation engine 215 may receive at least one local query 233 from a user (e.g., from a user device associated with the user, such as the example user device 105 shown in FIG. 1). The local query 233 received at the location recommendation engine 215 may be the user's first query about a location different from the user's current location (e.g., as determined by a GPS device or other similar user location detecting device such as the example user location detector 150 shown in FIG. 1) and, depending on the implementation, may trigger the building of a location recommendation model for the user about the different location.

As described above, the local query 233 may be a query about businesses, travel-related topics (e.g., accommodations, transportation, etc.), weather, and the like, for a given location/region/address/area/etc. different from the user's current location. In addition to receiving the local query 233, the location recommendation engine 215 may also receive data and/or information related to one or more of non-location user interest verticals 205, location-specific user interest verticals 210, social network associations 250, user location data 220, third-party search data 225, location-specific advertisements 230, location maps 235, and/or vertical maps for a specific location 240. In at least one embodiment, any or all of these various types of data and information inputs may be used by the location recommendation engine 215 to construct a location recommendation model for the user about a particular location. In one or more other embodiments of the disclosure, in addition to or instead of being used to construct a location recommendation model for the user, any or all of the example data and information inputs shown in FIG. 2 may also be used by the location recommendation engine 215 to generate personalized content relevant to the particular location, which may be provided for presentation to the user when, for example, the user is determined to be at or near the particular location.

It should be understood that various other data and/or information may also be inputs to the location recommendation engine 215 in addition to or instead of the example types and categories of data and information illustrated in FIG. 2 and described above. Depending on the implementation, the location recommendation engine 215 may be configured to receive (e.g., be provided with) certain data and/or information as inputs for use in building a location recommendation model for a user about a location, and be further configured to retrieve or collect similar or different data and/or information for use in generating personalized content relevant to the location to be provided as output to the user. Furthermore, the location recommendation engine 215 may receive some data and information for use in building a location recommendation model for a user, and then request additional and/or alternative data and information for use in generating personalized content relevant to the user's determined location of interest.

In one or more embodiments, the location recommendation engine 215 may use any or all of the various data and information described above to generate (e.g., create, assemble, compile, etc.) personalized or customized content for presentation to a user (e.g., customized content 133 provided to the user device 105 as shown in the example system and environment of FIG. 1). In at least the embodiment shown in FIG. 2, the location recommendation engine 215 may generate (e.g., using a location recommendation model constructed for the user based on the local query 233 and/or the example data inputs shown in FIG. 2) as output to be provided for presentation to the user one or more advertisements 255, web pages 260, maps 265, e-mails 270, alerts/notifications 275, and/or social network tools 280. These and other similar types of output are shown in the example user interfaces of FIGS. 5 and 6, which are described in greater detail below. Additionally, it should be understood that numerous other types and variations of content may also be output by the location recommendation engine 215 in addition to or instead of the example outputs described above and shown in FIG. 2.

Figure 3:
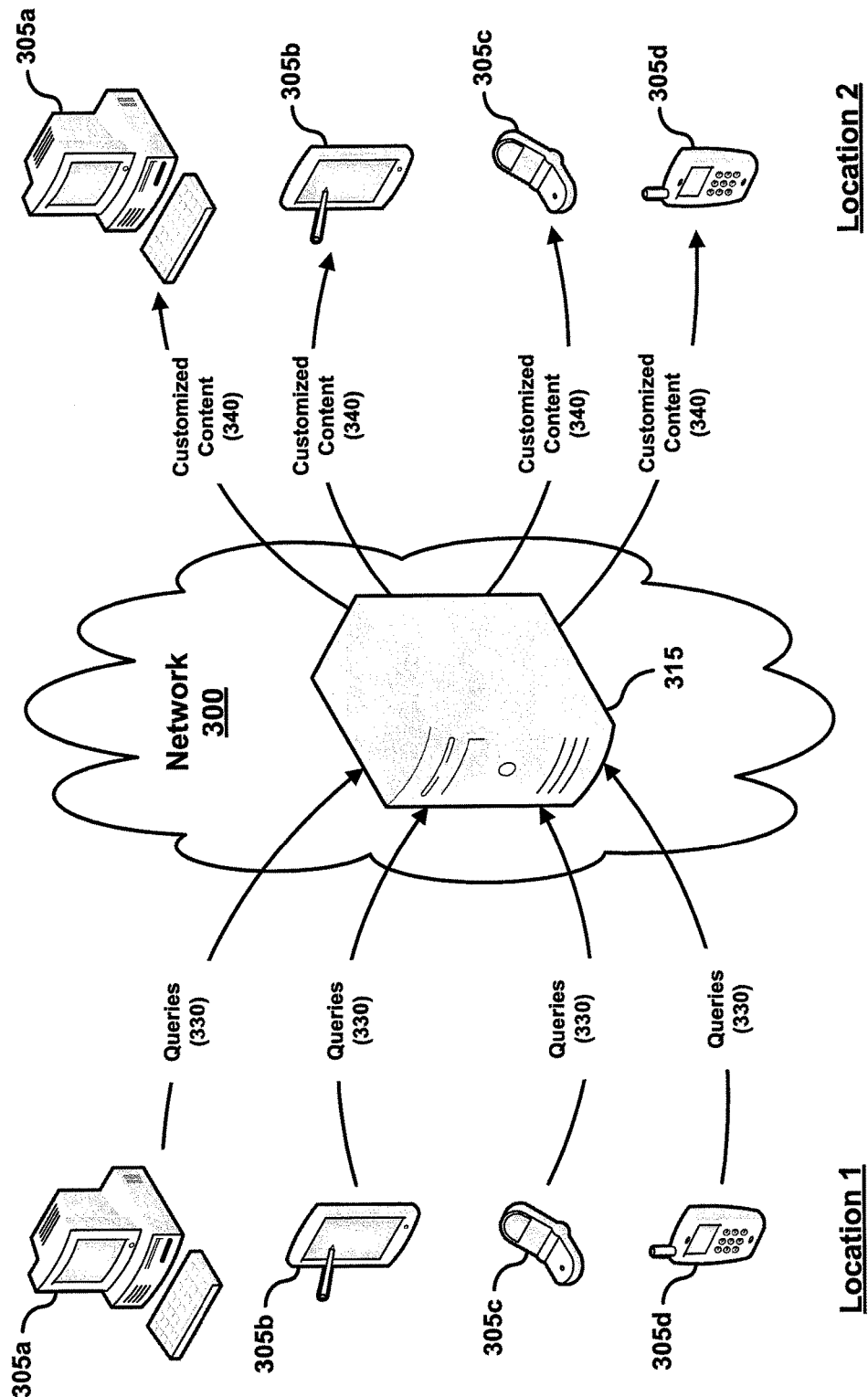
FIG. 3 is a schematic diagram illustrating example data flows between a location recommendation engine and user devices located at first and second locations according to one or more embodiments described herein.

FIG. 3 illustrates example data flows between a location recommendation engine and various user devices at a first and second location according to one or more embodiments described herein. Any one or more of example user devices 305a, 305b, 305c, and 305d may transmit to a location recommendation engine 350, via a network 300, one or more queries 330 made by a user at a first location (e.g., "Location 1"). Additionally, in at least some embodiments, any one or more of the user devices 305a, 305b, 305c, and 305d may also receive at a second location (e.g., "Location 2"), from the location recommendation engine 350, customized content 340.

In at least the example diagram shown in FIG. 3, the user devices 305a, 305b, 305c, and 305d may be a desktop computer, tablet computer, mobile telephone, and smartphone, respectively. However, it should be understood that numerous other types of user devices capable of sending and receiving data over a network (e.g., network 100 shown in FIG. 1) may also be one or more of the user devices 305a, 305b, 305c, and 305d in addition to or instead of the examples described above. The specific types of user devices described are only illustrative in nature, and are in no way intended to limit the scope of the present disclosure.

Figure 4:
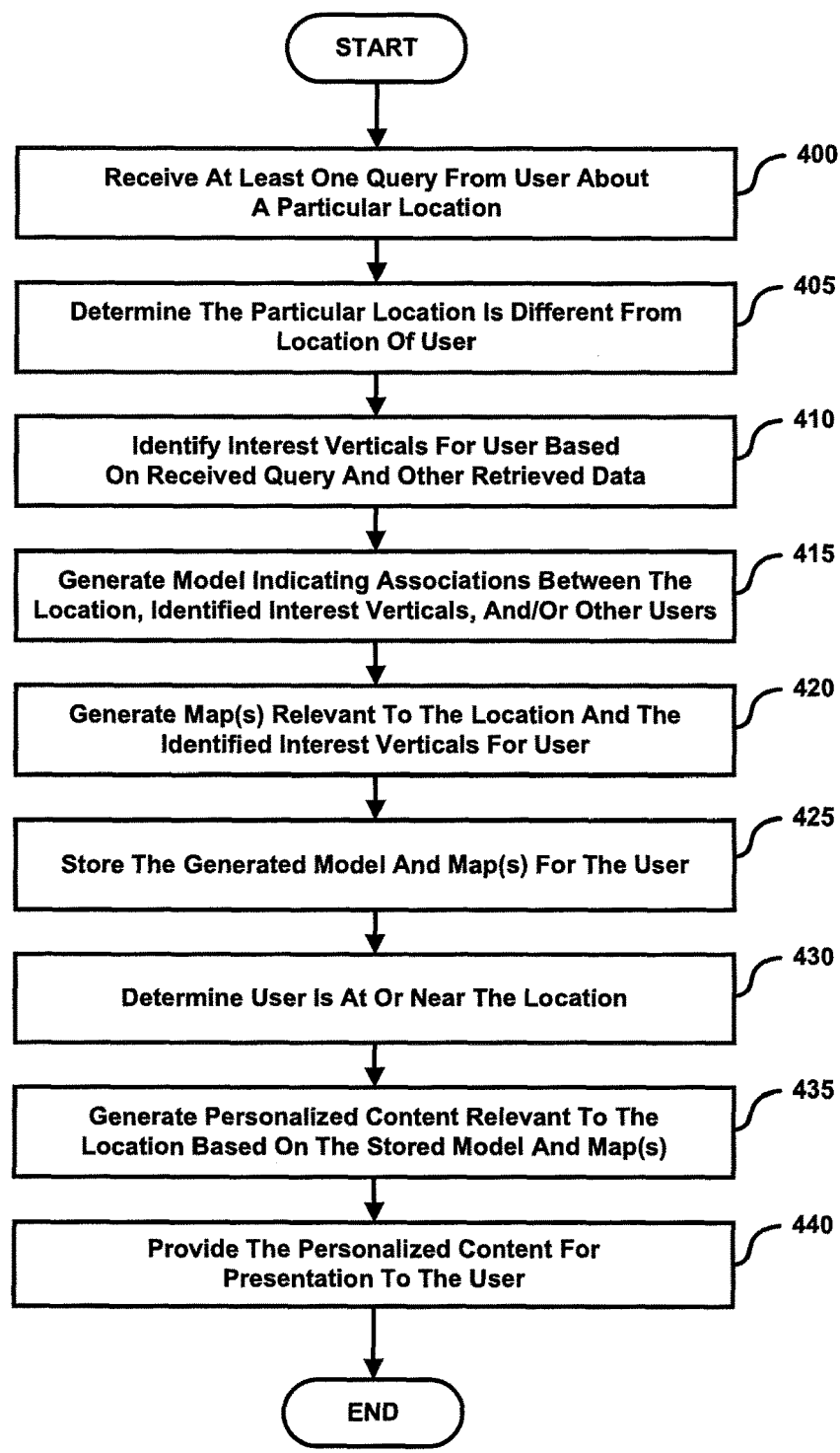
FIG. 4 is a flowchart illustrating an example method for generating a location recommendation model for a user about a particular location and providing the user with personalized content relevant to the particular location when it is determined that the user is at or near the location according to one or more embodiments described herein.

FIG. 4 illustrates an example process for generating a location recommendation model for a user about a particular location and providing the user with personalized content relevant to the particular location when it is determined that the user is at or near the location. In at least one embodiment, the process illustrated in FIG. 4 may be performed by a location recommendation engine (e.g., location recommendation engine 115 shown in FIG. 1, which in at least some implementations is a server).

The process begins at step 400 where at least one query is received from a user about a particular location. As described above, a variety of actions performed by a user may constitute a "query" for purposes of describing various embodiments of the present disclosure including, for example, a search performed online using a search engine or search service, a question submitted via a web page, a request made in an e-mail, etc. As such, some examples of a query that may be received from a user in step 400 include "hotels New York," "weather forecast for Orlando," "Chicago restaurants," and the like.

Once a query has been received from the user about a particular location in step 400, the process continues to step 405 where a determination may be made that the particular location queried about by the user is different from the user's location. For example, it may be determined that the query received in step 405, such as "hotels New York," is from a user who is currently located in San Francisco. In one or more embodiments, the location of the user considered in step 405 may be the user's "home" or "permanent" location, which may be a location previously or presently established as such based on an action of the user (e.g., the user setting or configuring his or her "home" or "permanent" location), on received and/or analyzed data about the user (e.g., data about the location(s) associated with previous queries made by the user), etc. Additionally, the location of the user may be determined using data about the user's location received from any of a variety of user location determination devices (e.g., user location detector 150 shown in the example system of FIG. 1). For example, in at least one embodiment, a user's location may be determined using data received from a global position system (GPS) associated with a device of the user, such as the user's mobile telephone.

It should be reiterated here that in any of the various scenarios in which the process illustrated in FIG. 4 and described in detail herein collect personal information about the user, the user may be given the option to not have his or her personal information collected and/or used in any way. For example, the user may be provided with an opportunity to opt in/out of programs or features that may collect personal information, such as information about the user's geographic location, preferences, interests, and the like. Furthermore, certain data about the user may be rendered anonymous in one or more ways before being stored and/or used, such that personally-identifiable information is removed. For example, a user's identity may be made anonymous so that no personally-identifiable information can be determined or collected for the user. Similarly, a user's geographic location may be generalized in situations where location information is obtained (e.g., limited to a city, zip code, or state level), such as in steps 410 and 430 of the process shown in FIG. 4, so that a particular location of a user cannot be determined.

After a determination is made in step 405 that the particular location queried about is different from the location of the user, the process moves to step 410 where one or more interest verticals may be identified for the user based on the query received in step 400. In at least some embodiments, the one or more interest verticals may be identified or determined for the user in step 410 (e.g., by a user vertical builder or module such as user vertical builder 160 shown in the example system of FIG. 1) based on various other data or information retrieved about the user in addition to or instead of the received query. For example, in addition to the received query, interest verticals may be identified for the user based data and/or information related to previous queries made by the user about one or more locations other than the particular queried location, previous queries made by the user unrelated to a location (e.g., professional baseball, movie premiers, rock climbing, etc.), social network associations and actions (e.g., interest verticals of the user's friends within a social network), and the like.

In step 415 of the process, a model (e.g., a location recommendation model such as that described above with respect to FIG. 2) is generated for the user about the particular location based on information extracted from (e.g., determined from, collected from, gathered from, etc.) the at least one query received from the user. In at least one embodiment, the model generated in step 415 may indicate one or more associations between the particular queried location, the one or more interest verticals identified for the user in step 410, one or more other users in a social network of the user, etc. Furthermore, in some embodiments described herein, the model generated for the user about the particular location in step 415 may be based on various other information in addition to or instead of the information extracted from the received query. For example, the generated model may also be based on information extracted from one or more queries received (e.g., at a location recommendation engine such as location recommendation engine 115 shown in FIG. 1) from the user about content other than the particular location.

In at least one embodiment, the generation of the model for the user in step 415 may occur in response to the query received from the user in step 400 being the first query received from the user about the particular location. For example, if the query received from the user in step 400 is "hotels New York" and no similar query relevant to New York has previously been received from the user, then such a query may initiate the building of the model about New York in step 415. Additionally, in another embodiment the building of the model for the particular location in step 415 may begin if the query received in step 400 is the first such query received from the user within a given period of time (e.g., previous three days, five days, two weeks, four weeks, two months, etc.).

Furthermore, depending on the implementation, various other thresholds in addition to or instead of one (1) may be used as a minimum number of queries that must be received from the user about a particular location before a model begins to be constructed for the user about the particular location in step 415 of the process shown in FIG. 4. For example, in one or more embodiments, the generation of the model about the particular location in step 415 may occur if the query received in step 400 is the second (or third, fourth, fifth, etc.) such query about the particular location received from the user. For example, if the query received from the user in step 400 is "hotels New York," and such a query is the third query relevant to New York received from the user, then receiving the query in step 400 may trigger the building of a model for the user about New York in step 415.

Additionally, in at least one embodiment of the present disclosure, the generation of the model about the particular location in step 415 of the process may occur in response to determining that the query received in step 400 meets a threshold number of queries received about the particular location from the user within a given period of time. For example, if the query received in step 400 is the second (or third, fourth, fifth, etc.) such query about the particular location received from the user within the previous week (or previous three days, five days, two weeks, four weeks, two months, etc.), then the model for the particular location may begin to be generated in step 415. It should be understood that numerous other received query thresholds and/or time periods may also be used in addition to or instead of the example thresholds and time periods described above.

In step 420 of the process, one or more maps relevant to the particular location and/or relevant to the interest verticals identified for the user may be generated. Some examples of the maps that may be generated in step 420 include geographic maps that allow a user to navigate his or her way around the particular location, weather maps indicating weather forecasts, traffic and transportation maps that highlight available travel routes and notify a user about traffic alerts or advisories, as well as numerous combinations of such maps and/or other maps containing a variety of content relevant to the particular location and/or relevant to identified interest verticals of the user.

In step 425 of the process, the model generated in step 415 and any maps generated in step 420 may be stored for later use or retrieval. In at least one embodiment, the model generated in step 415 may be stored in a models database (e.g., models database 190 shown in the example system of FIG. 1) and the map(s) generated in step 420 may be stored in a maps database (e.g., maps database 195 shown in the example system of FIG. 1).

In step 430, a determination is made that the user is at or near the particular location relevant to the query received from the user in step 400. Depending on the implementation, the determination that the user is at or near the particular location may be made using any of the various techniques described above with respect to step 410 of the process.

In response to determining that the user is at or near the particular location in step 430, in step 435 personalized or customized content relevant to the particular location may be generated for the user based on the model and map(s) stored in step 425. In at least one embodiment, the personalized content generated in step 435 may be in the form of one or more advertisements, web pages, maps, e-mails, alerts/notifications, social network tools (e.g., advertisements 255, web pages 260, maps 265, e-mails 270, alerts/notifications 275, social network tools 280 as shown in FIG. 2), and/or various other similar types of content relevant to the location. Some examples of the types of personalized content generated for the user in step 435 are shown in the example user interfaces of FIGS. 5 and 6, which are described in greater detail below.

The process then continues to step 440 where the personalized content generated for the user in step 435 is provided for presentation to the user. In at least one embodiment, the personalized content generated for the user may be served, via a network, to a user device (e.g., served by location recommendation engine 115 to user device 105 via network 100 as shown in the example system and environment of FIG. 1) in a format suitable for presentation on the user device.

Figure 5:
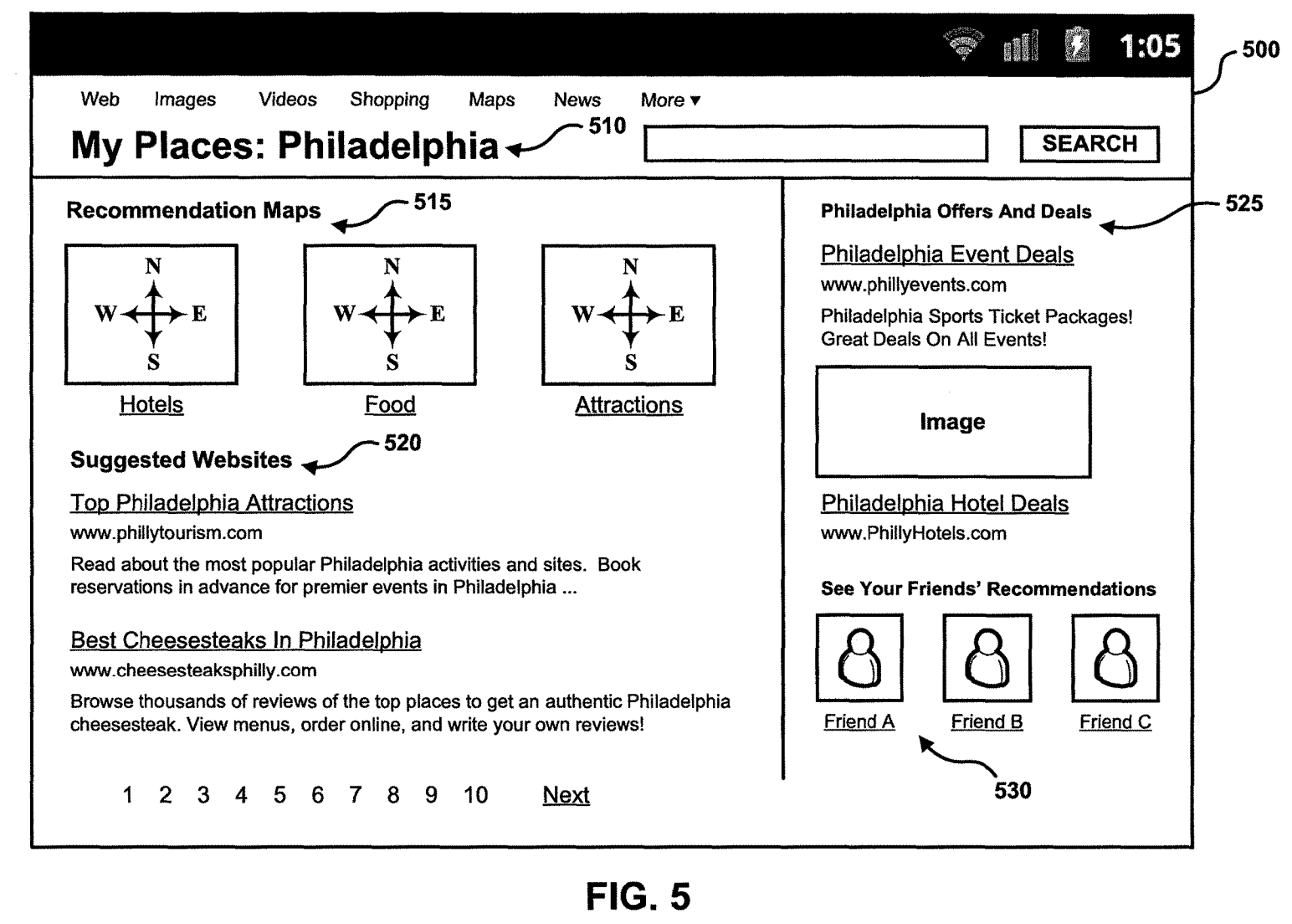
Figure 6:
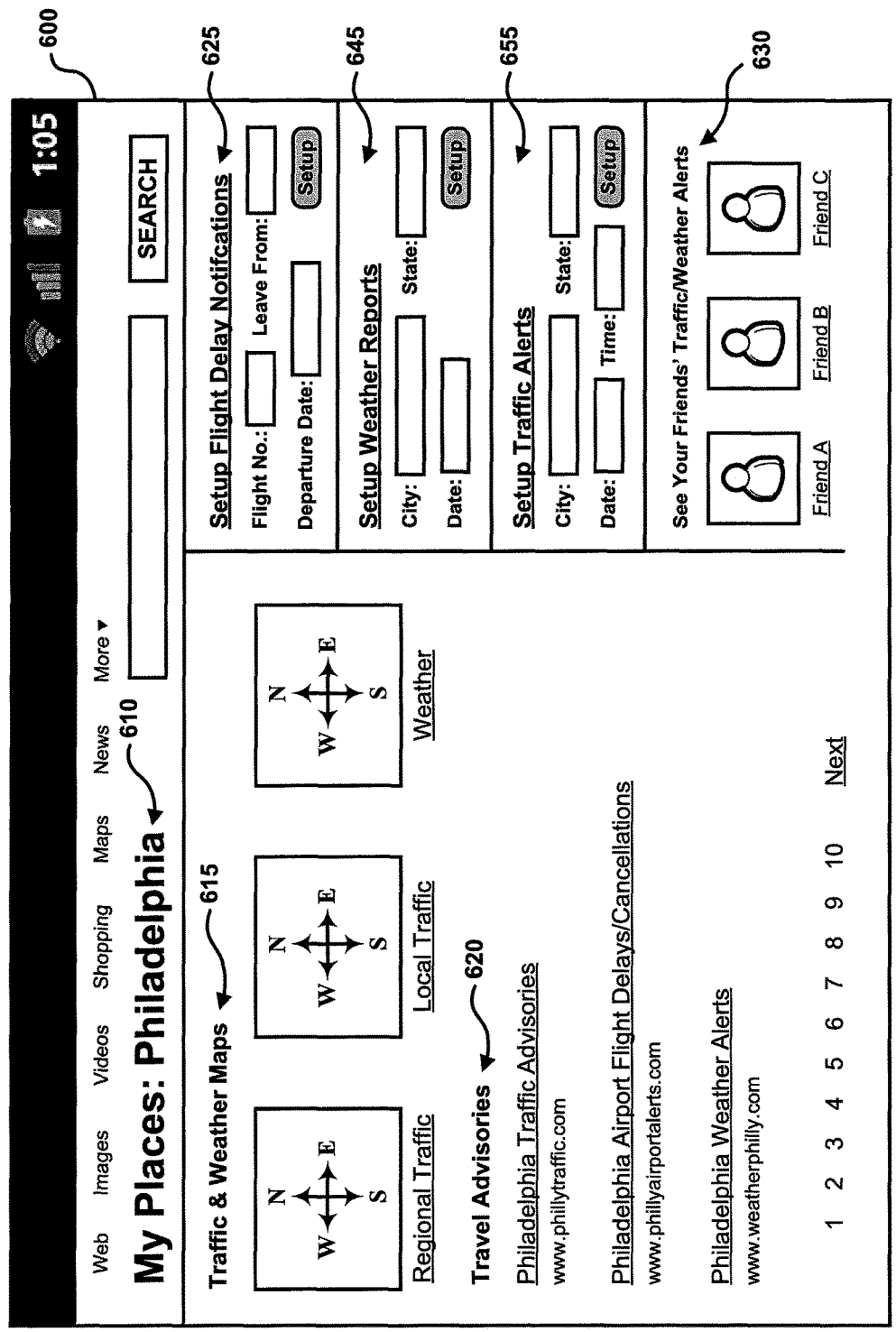
FIG. 6 is an example user interface that includes location-specific content and one or more user controls for setting alerts and notifications according to one or more embodiments described herein.

FIGS. 5 and 6 illustrate example user interfaces that may be used in implementing one or more of the features of the various methods and systems described herein. Various features and components of the illustrative user interface screens presented in FIGS. 5 and 6 are described in the context of an example scenario involving Philadelphia, where Philadelphia is determined to be a location of interest to a user, and where the user may be presented with either or both of the example user interfaces 500 and 600 shown in FIGS. 5 and 6, respectively. It should be understood that the particular scenario presented by, and the particular subject-matter of the content contained in either of the example user interfaces of FIGS. 5 and 6, as well as the arrangement of any of the various components comprising the example user interfaces are for illustrative purposes only, and are not in any way intended to limit the scope of the present disclosure.

As will be described in greater detail below, some of the components included in the example user interfaces shown in FIGS. 5 and 6 may represent or be used to implement one or more features of the various embodiments of the present disclosure. However, numerous other variations, types, combinations, and arrangements of user interfaces may also be used to represent and/or to implement such features in addition to or instead of the example user interfaces shown.

FIG. 5 is an example user interface that includes content and recommendations relevant to a particular location determined to be of interest to a user according to one or more embodiments described herein.

In at least one embodiment, the example user interface screen 500 may be generated for a user by a location recommendation engine (e.g., location recommendation engine 215 shown in FIG. 2), and may also be based on a location recommendation model constructed for the user by the location recommendation engine. For example, the user interface screen 500 and the various content contained therein may be based on one or more data and information inputs retrieved by the location recommendation engine during construction of a location recommendation model for the user, where such model construction may be in response to the location recommendation engine receiving at least one query from the user about a particular location (e.g., local query 233 shown in FIG. 2) different from the user's current location.

In at least one embodiment, the user interface screen 500 includes content and recommendations for a particular location 510 determined to be of interest to a user, represented as "My Places: Philadelphia" in the illustrative example shown in FIG. 5. The user interface screen 500 may also include one or more recommendation maps 515, suggested websites 520, and various offers and deals 525 relevant to the particular location. Additionally, in one or more embodiments, the user interface screen 500 may also include suggested content and/or recommendations of one or more of the user's friends 530. For example, where the user is a member of a social network, one or more of the user's friends in the social network (e.g., connections, acquaintances, relations, etc.) may have recommendations relevant to the particular location that they wish to share with the user.

FIG. 6 is an example user interface that includes content relevant to a particular location determined to be of interest to a user along with one or more user controls for setting alerts and/or notifications according to one or more embodiments described herein.

Similar to the example user interface screen 500 shown in FIG. 5, in at least one embodiment of the disclosure, the example user interface screen 600 may be generated for a user by a location recommendation engine (e.g., location recommendation engine 215 shown in FIG. 2), and may also be based on a location recommendation model constructed for the user by the location recommendation engine. For example, the user interface screen 600 and any of the various content contained therein may be based on one or more data and information inputs retrieved by the location recommendation engine during construction of a location recommendation model for the user. In at least one scenario, such construction of a location recommendation model may be in response to the location recommendation engine receiving at least one query from the user about a particular location (e.g., local query 233 shown in FIG. 2) different from the user's current location.

In at least one embodiment, the user interface screen 600 includes content and various user controls for setting alerts and/or notifications for a particular location 610 determined to be of interest to a user, represented again as "My Places: Philadelphia" in the illustrative example shown in FIG. 6. The user interface screen 600 may include one or more traffic and/or weather maps 615 and also travel advisories 620 relevant to the particular location.

Additionally, in one or more embodiments, the user interface screen 600 may also include numerous user controls designed to allow the user to setup various alerts and/or notifications for travel, weather, traffic, and the like, relevant to the particular location of interest. For example, the user interface screen 600 may include controls to setup flight delay notifications 625, setup weather reports 645, and also to setup traffic alerts 655. Furthermore, in at least some embodiments, the user interface screen 600 may also include various traffic and/or weather alerts created by one or more of the user's friends 630 (e.g., friends within the context of a social network). For example, one or more of the user's friends who are located in or near Philadelphia may setup traffic or weather alerts or advisories that they can then share with or otherwise make available to the user.

Figure 7:
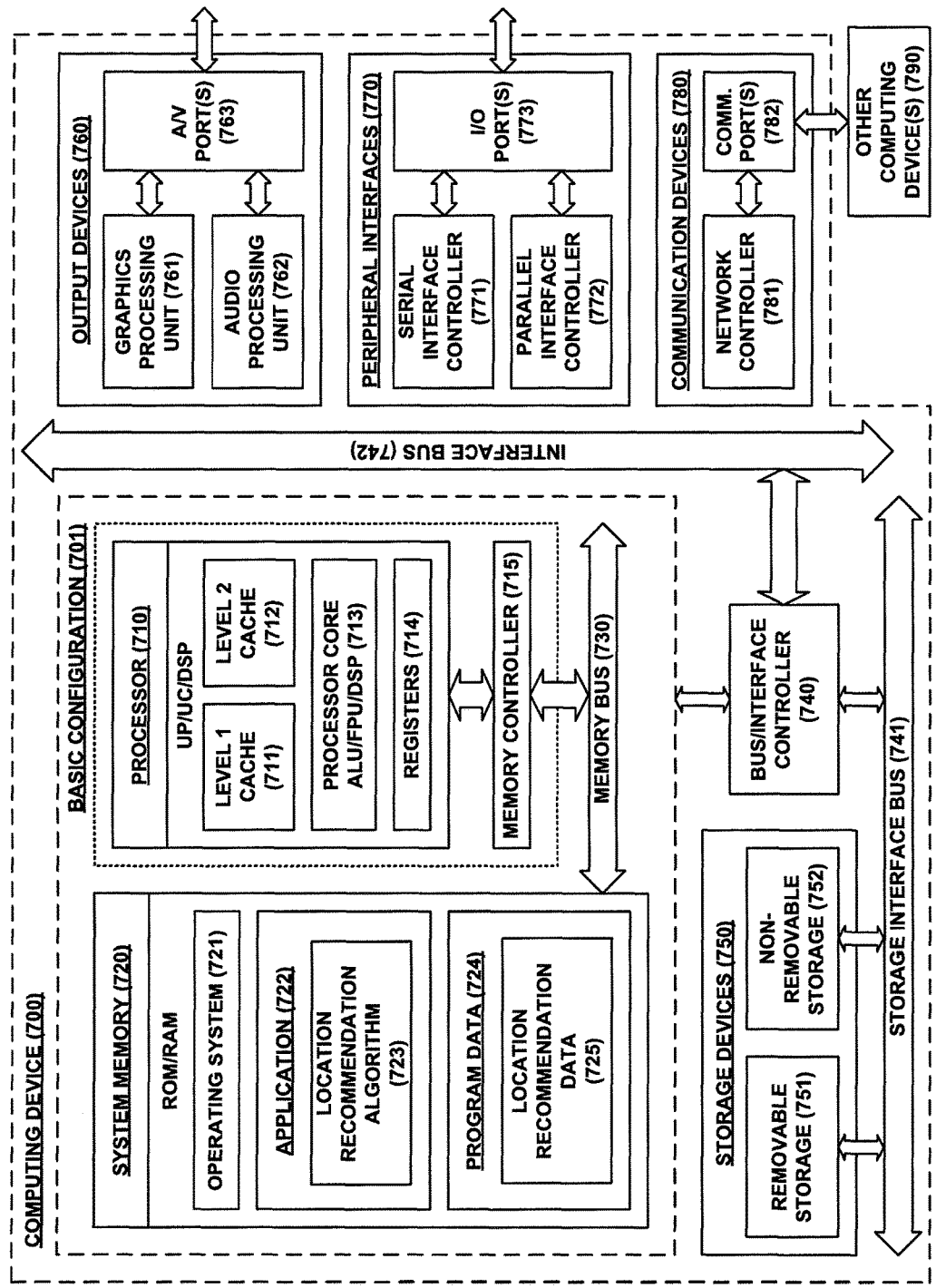
FIG. 7 is a block diagram illustrating an example computing device arranged for generating and presenting location-specific content according to one or more embodiments described herein.

FIG. 7 is a block diagram illustrating an example computing device 700 that is arranged for generating and presenting personalized content relevant to a location (e.g., recommendations, advertisements, etc.) to a user or user device in accordance with one or more embodiments of the present disclosure. In a very basic configuration 701, computing device 700 typically includes one or more processors 710 and system memory 720. A memory bus 730 may be used for communicating between the processor 710 and the system memory 720.

Depending on the desired configuration, processor 710 can be of any type including but not limited to a microprocessor (µP), a microcontroller (µC), a digital signal processor (DSP), or any combination thereof. Processor 710 may include one or more levels of caching, such as a level one cache 711 and a level two cache 712, a processor core 713, and registers 714. The processor core 713 may include an arithmetic logic unit (ALU), a floating point unit (FPU), a digital signal processing core (DSP Core), or any combination thereof. A memory controller 715 can also be used with the processor 710, or in some embodiments the memory controller 715 can be an internal part of the processor 710.

Depending on the desired configuration, the system memory 720 can be of any type including but not limited to volatile memory (e.g., RAM), non-volatile memory (e.g., ROM, flash memory, etc.) or any combination thereof. System memory 720 typically includes an operating system 721, one or more applications 722, and program data 724. In at least some embodiments, application 722 includes a location recommendation algorithm 723 that is configured to generate a location recommendation model for a user based on various data received about the user (e.g., data contained in one or more queries made by the user), and use the location recommendation model to select one or more content items, such as web pages or advertisements, to provide to a user device for presentation to the user. The location recommendation algorithm is further arranged to identify candidate content items for presentation to a user and then select from among those candidates one or more content items based on information and data associated with the user (e.g., a stored location recommendation model, stored interest vertical maps and/or data, etc.).

Program Data 724 may include location recommendation data 725 that is useful for generating a location recommendation model for a user, and also for selecting an item of content (e.g., a web page or an advertisement) for presentation to the user. In some embodiments, application 722 can be arranged to operate with program data 724 on an operating system 721 such that a location recommendation model can be built for a user based on data and information collected or received about queries made by the user and identified interest verticals of the user, and then used to select one or more content items for presentation to the user.

Computing device 700 can have additional features and/or functionality, and additional interfaces to facilitate communications between the basic configuration 701 and any required devices and interfaces. For example, a bus/interface controller 740 can be used to facilitate communications between the basic configuration 701 and one or more data storage devices 750 via a storage interface bus 741. The data storage devices 750 can be removable storage devices 751, non-removable storage devices 752, or any combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), tape drives and the like. Example computer storage media can include volatile and nonvolatile, removable and non-removable media implemented in any method or technology for storage of information, such as computer readable instructions, data structures, program modules, and/or other data.

System memory 720, removable storage 751 and non-removable storage 752 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 700. Any such computer storage media can be part of computing device 700.

Computing device 700 can also include an interface bus 742 for facilitating communication from various interface devices (e.g., output interfaces, peripheral interfaces, communication interfaces, etc.) to the basic configuration 701 via the bus/interface controller 740. Example output devices 760 include a graphics processing unit 761 and an audio processing unit 762, either or both of which can be configured to communicate to various external devices such as a display or speakers via one or more A/V ports 763. Example peripheral interfaces 770 include a serial interface controller 771 or a parallel interface controller 772, which can be configured to communicate with external devices such as input devices (e.g., keyboard, mouse, pen, voice input device, touch input device, etc.) or other peripheral devices (e.g., printer, scanner, etc.) via one or more I/O ports 773. An example communication device 780 includes a network controller 781, which can be arranged to facilitate communications with one or more other computing devices 790 over a network communication (not shown) via one or more communication ports 782. The communication connection is one example of a communication media.

Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 700 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 700 can also be implemented as a personal computer including both laptop computer and non-laptop computer configurations.

There is little distinction left between hardware and software implementations of aspects of systems; the use of hardware or software is generally (but not always, in that in certain contexts the choice between hardware and software can become significant) a design choice representing cost versus efficiency tradeoffs. There are various vehicles by which processes and/or systems and/or other technologies described herein can be effected (e.g., hardware, software, and/or firmware), and the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation. In one or more other scenarios, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof.

In one or more embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments described herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof. Those skilled in the art will further recognize that designing the circuitry and/or writing the code for the software and/or firmware would be well within the skill of one of skilled in the art in light of the present disclosure.

Additionally, those skilled in the art will appreciate that the mechanisms of the subject matter described herein are capable of being distributed as a program product in a variety of forms, and that an illustrative embodiment of the subject matter described herein applies regardless of the particular type of signal-bearing medium used to actually carry out the distribution. Examples of a signal-bearing medium include, but are not limited to, the following: a recordable-type medium such as a floppy disk, a hard disk drive, a Compact Disc (CD), a Digital Video Disk (DVD), a digital tape, a computer memory, etc.; and a transmission-type medium such as a digital and/or an analog communication medium (e.g., a fiber optic cable, a waveguide, a wired communications link, a wireless communication link, etc.).

Those skilled in the art will also recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A system to expedite model generation for selection of location-based content by a location recommendation engine, comprising:
   the location recommendation engine executed by at least one processor of a server, the location recommendation engine comprising a query processor, a vertical builder, and a location detector, the location recommendation engine to:
   receive, via a computer network, a first query about a first location input into a web browser of a client device located at a second location different from the first location;
   extract a first keyword from the first query;
   identify a first interest vertical for the client device based on the first keyword extracted from the first query by the query processor;
   receive, via the computer network, a second query about the first location input into the web browser of the client device located at the second location;
   extract a second keyword from the second query;
   identify a second interest vertical for the client device based on the second keyword;
   determine, responsive to reception of the first query and the second query, that a number of received queries about the first location is greater than or equal to a threshold number of queries;
   determine the second location of the client device is different from the first location that the first query and the second query are about;
   generate, prior to arrival of the client device at the first location and responsive to the determination that the second location is different from the first location and the number of received queries is greater than or equal to the threshold number of queries, a model for the first location based on the first interest vertical and the second interest vertical, the model indicating an association between the first location and the first interest vertical and the first location and the second interest vertical, wherein the model for the first location includes queries received about the first location from the second location;
   detect that the client device is at the first location and not at the second location;
   identify, responsive to detection of the client device at the first location, content customized for the first location and at least one of the first interest vertical and the second interest vertical identified for the client device based on the model stored for the first location; and
   transmit, to the client device via the computer network, the content in a format for presentation via at least one of the web browser or an application executed by the client device.

2. The system of claim 1, comprising the location recommendation engine to:
   initiate generation of the model for the first location prior to the client device arriving at the first location and responsive to the number of received queries is greater than or equal to the threshold number of queries.

3. The system of claim 1, comprising the location recommendation engine to:
   initiate generation of the model for the first location prior to the client device arriving at the first location and responsive to the number of received queries is greater than or equal to the threshold number of queries during a time period.

4. The system of claim 1, comprising the location recommendation engine to:
   initiating, by the location recommendation engine, generation of the model for the first location prior to the client device arriving at the first location and responsive to receiving at least one query about the first location from the client device located not at the first location.

5. The system of claim 1, comprising the location recommendation engine to:
   initiate generation of the model for the first location prior to the client device arriving at the first location and responsive to receiving at least one query about the first location from the client device located not at the first location during a predefined period of time.

6. The system of claim 1, comprising the location recommendation engine to:
   generate an interest vertical map based on the first interest vertical and the second interest vertical, the interest vertical map identifying associations between the first interest vertical and the second interest vertical and the first location, wherein the first interest vertical and the second interest vertical are specific to the first location.

7. The system of claim 1, comprising the location recommendation engine to:
   generate an interest vertical map based on the first interest vertical and the second interest vertical, the interest vertical map identifying associations between the first interest vertical and the second interest vertical and the second location;
retrieve the content relevant to the first location and the first interest vertical and the second interest vertical using the model generated for the first location;
combine the content and the interest vertical map; and
transmit, via the computer network, the combined content and the interest vertical map to the client device.

8. The system of claim 1, comprising the location recommendation engine to:
generate the model for the first location based on information extracted from a third query received from the client device about a third location different from the first location.

9. The system of claim 1, comprising the location recommendation engine to:
receive a third query from the client device;
determine that the third query originated from a location within a geographical range of the first location; and
generate data indicating that the client device is at the first location.

10. The system of claim 1, comprising the location recommendation engine to:
identify the content customized based on the model stored for the first location to include machine-executable instructions.

11. A method of expediting model generation for selection of location-based content by a location recommendation engine, comprising:
receiving, by a query processor of the location recommendation engine executed by a server, via a computer network, a first query about a first location input into a web browser of a client device located at a second location different from the first location;
extracting, by the query processor, a first keyword from the first query;
identifying, via a vertical builder of the location recommendation engine, a first interest vertical for the client device based on the first keyword extracted from the first query by the query processor;
receiving, by the query processor via the computer network, a second query about the first location input into the web browser of the client device located at the second location;
extracting, by the query processor, a second keyword from the second query;
identifying, via the vertical builder, a second interest vertical for the client device based on the second keyword;
determining, by the location recommendation engine responsive to receiving the first query and the second query, that a number of received queries about the first location is greater than or equal to a threshold number of queries;
determining, via a location detector of the location recommendation engine, the second location of the client device is different from the first location that the first query and the second query are about;
generating, by the location recommendation engine prior to the client device arriving at the first location and responsive to determining that the second location is different from the first location and the number of received queries is greater than or equal to the threshold number of queries, a model for the first location based on the first interest vertical and the second interest vertical, the model indicating an association between the first location and the first interest vertical and the first location and the second interest vertical, wherein the model for the first location includes queries received about the first location from the second location;
detecting, by the location detector, that the client device is at the first location and not at the second location;
identifying, by the location recommendation engine responsive to detecting that the client device is at the first location, content customized for the first location and at least one of the first interest vertical and the second interest vertical identified for the client device based on the model stored for the first location; and
transmitting, by the location recommendation engine to the client device via the computer network, the content in a format for presentation via at least one of the web browser or an application executed by the client device.

12. The method of claim 11, comprising:
initiating, by the location recommendation engine, generation of the model for the first location prior to the client device arriving at the first location and responsive to the number of received queries is greater than or equal to the threshold number of queries.

13. The method of claim 11, comprising:
initiating, by the location recommendation engine, generation of the model for the first location prior to the client device arriving at the first location and responsive to the number of received queries is greater than or equal to the threshold number of queries during a time period.

14. The method of claim 11, comprising:
initiating, by the location recommendation engine, generation of the model for the first location prior to the client device arriving at the first location and responsive to receiving at least one query about the first location from the client device located not at the first location.

15. The method of claim 11, comprising:
initiating, by the location recommendation engine, generation of the model for the first location prior to the client device arriving at the first location and responsive to receiving at least one query about the first location from the client device located not at the first location during a predefined period of time.

16. The method of claim 11, comprising:
generating, by the location recommendation engine, an interest vertical map based on the first interest vertical and the second interest vertical, the interest vertical map identifying associations between the first interest vertical and the second interest vertical and the first location, wherein the first interest vertical and the second interest vertical are specific to the first location.

17. The method of claim 11, comprising:
generating, by the location recommendation engine, an interest vertical map based on the first interest vertical and the second interest vertical, the interest vertical map identifying associations between the first interest vertical and the second interest vertical and the second location;
retrieving, by the location recommendation engine, the content relevant to the first location and the first interest vertical and the second interest vertical using the model generated for the first location;
combining, by the location recommendation engine, the content and the interest vertical map; and transmitting, via the computer network, the combined content and the interest vertical map to the client device.

18. The method of claim 11, comprising:

generating the model for the first location based on information extracted from a third query received from the client device about a third location different from the first location.

19. The method of claim 11, comprising:

receiving, by the location recommendation engine, a third query from the client device;

determining that the third query originated from a location within a geographical range of the first location; and generating data indicating that the client device is at the first location.

20. The method of claim 11, comprising:

identifying the content customized based on the model stored for the first location to include machine-executable instructions.

* * * * *